(12) United States Patent
Liao

(10) Patent No.: US 9,502,548 B1
(45) Date of Patent: Nov. 22, 2016

(54) SEMICONDUCTOR DEVICE

(71) Applicant: DELTA ELECTRONICS, INC., Taoyuan (TW)

(72) Inventor: Wen-Chia Liao, Taoyuan (TW)

(73) Assignee: DELTA ELECTRONICS, INC. (TW)

( * ) Notice: Subject to any disclaimer, the term of this patent is extended or adjusted under 35 U.S.C. 154(b) by 0 days.

(21) Appl. No.: 14/851,218

(22) Filed: Sep. 11, 2015

(30) Foreign Application Priority Data

Jul. 3, 2015 (TW) .............................. 104121600 A

(51) Int. Cl.
H01L 29/80 (2006.01)
H01L 29/778 (2006.01)
H01L 29/40 (2006.01)

(52) U.S. Cl.
CPC ........... H01L 29/778 (2013.01); H01L 29/402 (2013.01)

(58) Field of Classification Search
CPC ........... H01L 29/778; H01L 29/66431; H01L 29/66462; H01L 29/402
USPC ....................................... 257/256
See application file for complete search history.

(56) References Cited

U.S. PATENT DOCUMENTS

| | | |
|---|---|---|
| 7,800,131 B2 | 9/2010 | Miyamoto et al. |
| 8,530,936 B2 | 9/2013 | Ishii |
| 2009/0267116 A1* | 10/2009 | Wu ...................... H01L 29/7787 257/194 |
| 2013/0193485 A1* | 8/2013 | Akiyama .......... H01L 29/66431 257/194 |

FOREIGN PATENT DOCUMENTS

TW          201314894          4/2013

* cited by examiner

*Primary Examiner* — Tu-Tu Ho
(74) *Attorney, Agent, or Firm* — Hauptman Ham, LLP

(57) ABSTRACT

A semiconductor device includes a substrate, an active layer, a source electrode, a drain electrode, a gate electrode, a field plate, a first passivation layer, and a metal layer. The active layer is disposed on the substrate. The source electrode and the drain electrode are respectively electrically connected to the active layer. The gate electrode is disposed between the source electrode and the drain electrode and above the active layer. The field plate is disposed above the active layer and between the gate electrode and the drain electrode. The first passivation layer covers the gate electrode and the field plate. The metal layer is disposed on the first passivation layer, is disposed above the gate electrode and the field plate, and is electrically connected to the source electrode.

13 Claims, 2 Drawing Sheets

SEMICONDUCTOR DEVICE

RELATED APPLICATIONS

This application claims priority to Taiwan Application Serial Number 104121600, filed Jul. 3, 2015, which is herein incorporated by reference.

BACKGROUND

Field of Invention

The present invention relates to a semiconductor device.

Description of Related Art

As a form of a field effect transistor (FET), a high electron mobility transistor (HEMT) is widely used in the art because of its high electron mobility and low resistance. The key element within a HEMT is a heterojunction formed by two materials with different band gaps instead of a pn-junction used in the conventional FET. A commonly used material combination is AlGaN and GaN. Since the heterojunction created by AlGaN and GaN forms a quantum well in the conduction band on the GaN side, a two-dimensional electron gas (2DEG) appears at the interface of AlGaN and GaN.

SUMMARY

An aspect of the present invention is to provide a semiconductor device including a substrate, an active layer, a source electrode, a drain electrode, a gate electrode, a field plate, a first passivation layer and a metal layer. The active layer is disposed on the substrate. The source electrode and the drain electrode respectively connect to the active layer. The gate electrode is disposed between the source electrode and the drain electrode and above the active layer. The field plate is disposed above the active layer and between the gate electrode and the drain electrode. The first passivation layer covers the gate electrode and the field plate. The metal layer is disposed on the first passivation layer, is disposed above the gate electrode and the field plate, and is electrically connected to the source electrode.

In one or more embodiments, a first distance is formed between the gate electrode and the active layer, a second distance is formed between the field plate and the active layer, and the second distance is shorter than the first distance.

In one or more embodiments, a portion of the first passivation layer disposed between the gate electrode and the metal layer has a thickness less than 500 nanometers.

In one or more embodiments, a gap is formed between the gate electrode and the field plate, and the metal layer entirely covers the gap.

In one or more embodiments, wherein a side of the metal layer facing the source electrode is disposed above the gate electrode.

In one or more embodiments, wherein a side of the metal layer facing the drain electrode is disposed above the field plate.

In one or more embodiments, the first distance is about 20 nanometers to about 200 nanometers.

In one or more embodiments, wherein the second distance is about 50 nanometers and about 300 nanometers.

In one or more embodiments, the field plate is electrically connected to the source electrode.

In one or more embodiments, the field plate is electrically connected to the gate electrode.

In one or more embodiments, the semiconductor device further includes a second passivation layer disposed between the field plate and the active layer.

In one or more embodiments, wherein the metal layer entirely covers the gate electrode.

In one or more embodiments, a horizontal distance between the metal layer and the drain electrode is shorter than a horizontal distance between the field plate and the drain electrode.

DETAILED DESCRIPTION

Figure 1:
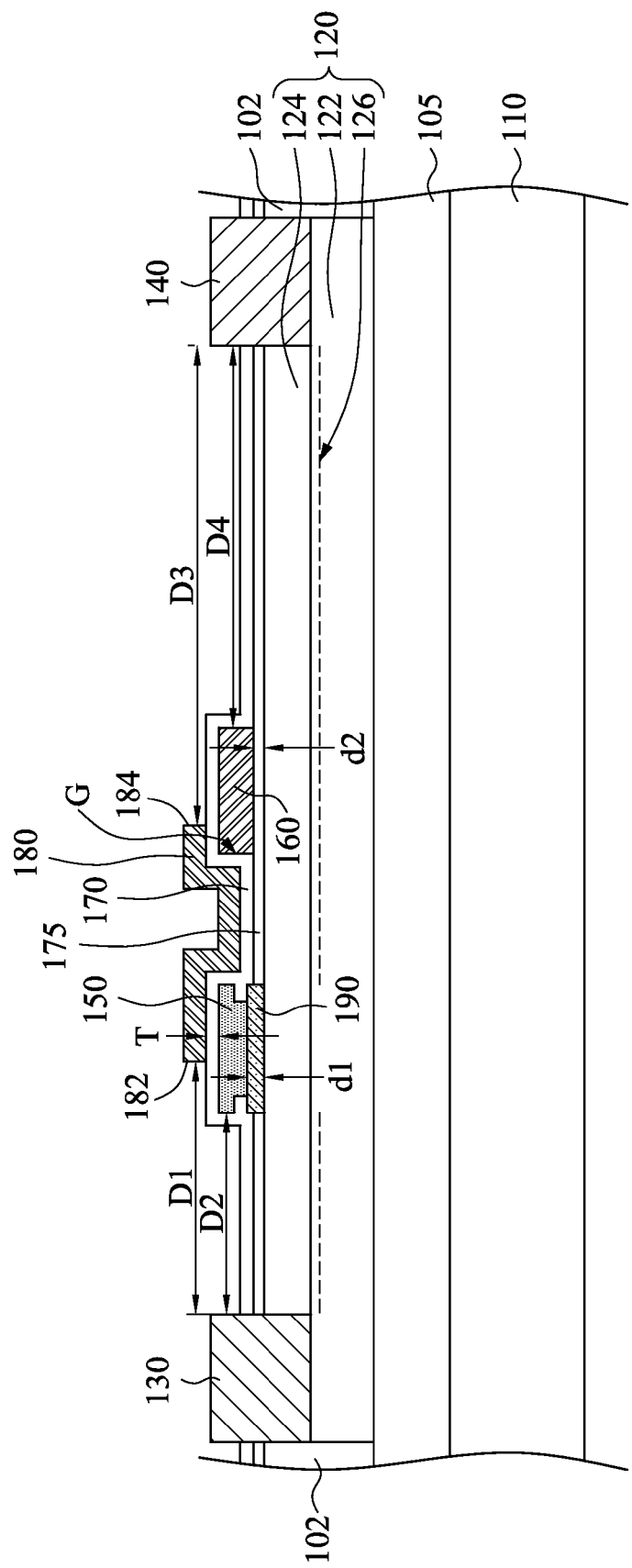
FIG. 1 is a cross-sectional view of a semiconductor device according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a semiconductor device according to one embodiment of the present invention. The semiconductor device includes a substrate 110, an active layer 120, a source electrode 130, a drain electrode 140, a gate electrode 150, a field plate 160, a first passivation layer 170, and a metal layer 180. The active layer 120 is disposed on the substrate 110. The source electrode 130 and the drain electrode 140 respectively connect to the active layer 120. For example, in FIG. 1, a part of the source electrode 130 and a part of the drain electrode 140 are disposed in the active layer 120, however, in some other embodiments, the source electrode 130 and the drain electrode 140 can be disposed on the active layer 120. The gate electrode 150 is disposed between the source electrode 130 and the drain electrode 140 and above the active layer 120. A first distance d1 is formed between the gate electrode 150 and the active layer 120. The field plate 160 is disposed above the active layer 120 and between the gate electrode 150 and the drain electrode 140. A second distance d2 is formed between the field plate 160 and the active layer 120. The second distance d2 is shorter than the first distance d1. The first passivation layer 170 covers the gate electrode 150 and the field plate 160. The metal layer 180 is disposed on the first passivation layer 170, is disposed above the gate electrode 150 and the field plate 160, and is electrically connected to the source electrode 130.

In this embodiment, the gate-source capacitance (Cgs) of the semiconductor device can be adjusted by the metal layer 180. Since the second distance d2 is shorter than the first distance d1, the breakdown voltage of the semiconductor device is promoted. More specifically, in this embodiment, a portion of the metal layer 180 is disposed above the gate electrode 150, that is, a portion of the metal layer 180 overlaps the gate electrode 150. Since the metal layer 180 is electrically connected to the source electrode 130, a gate-source capacitance (Cgs) between the source electrode 130 and the gate electrode 150 thereby is formed. The aforementioned arrangement makes the gate-source capacitance of the semiconductor device increase, thereby reducing Miller ratio of the semiconductor device, wherein the Miller ratio is reverse proportional to the gate-source capacitance. The lower the Miller ratio, the better the operation status of the semiconductor device. In this way, high frequency operations are easier to be achieved while the shoot-through current is minimized. Moreover, there is a high electric field between the gate electrode 150 and the active layer 120. Once a source-drain voltage is applied to the semiconductor device, the electric field will rapidly increase and reach the breakdown voltage of the semiconductor device. However, in this embodiment, since the field plate 160 is disposed between the gate electrode 150 and the drain electrode 140, and the second distance d2 is shorter than the first distance d1, that is, the field plate 160 is lower than the gate electrode 150. In this way, when the device is applied a high source-drain voltage, a part of the electric field can be effectively shifted to the place around the field plate 160 to make the increases of the electric field of the gate electrode 150 around a side of the drain electrode 140 reduced, thereby increasing the breakdown voltage of the semiconductor device.

In one example, when the metal layer 180 existed, the gate-source charge (Qgs(th)) was about 1.1(nC/m), and the Miller ratio was about 2.4. In addition, when there was no metal layer 180, the gate-source charge (Qgs(th)) was about 1.8(nC/m), and the Miller ratio was about 1.2.

In this embodiment, a portion of the first passivation layer 170 disposed between the gate electrode 150 and the metal layer 180 has a thickness T, and the thickness T is less than 500 nanometers. In some other embodiments, the thickness T is less than 300 nanometers. In some other embodiments, the thickness T is less than 100 nanometers. By adjusting the thickness T, the gate-source capacitance between the gate electrode 150 and the metal layer 180 can be changed. In addition, when the overlapping area between the gate electrode 150 and the metal layer 180 differs, the gate-source capacitance between the gate electrode 150 and the metal layer 180 can be changed accordingly. Therefore, a person skilled in the art can decide the overlapping area between the gate electrode 150 and the metal layer 180 according to the actual situation.

In this embodiment, a gap G is formed between the gate electrode 150 and the field plate 160, and the metal layer 180 entirely covers the gap G. In other words, the metal layer 180 overlaps both the gate electrode 150 and the field plate 160, and the edges of the metal layer 180 are not disposed in the gap G. Since the electric field is tend to be aggregated at the edges of the metal layer 180 (i.e., the fringing electric field), in this embodiment, the metal layer 180 thereby entirely covers the gap G, that is, the sides 182, and 184 of the metal layer 180 are not disposed in the gap G, to avoid the fringing electric field of the metal layer 180 being generated at the gap G. The fringing electric field would interfere the electric field distribution above the active layer 120, and would probably change the breakdown voltage of the semiconductor device.

Figure 2:
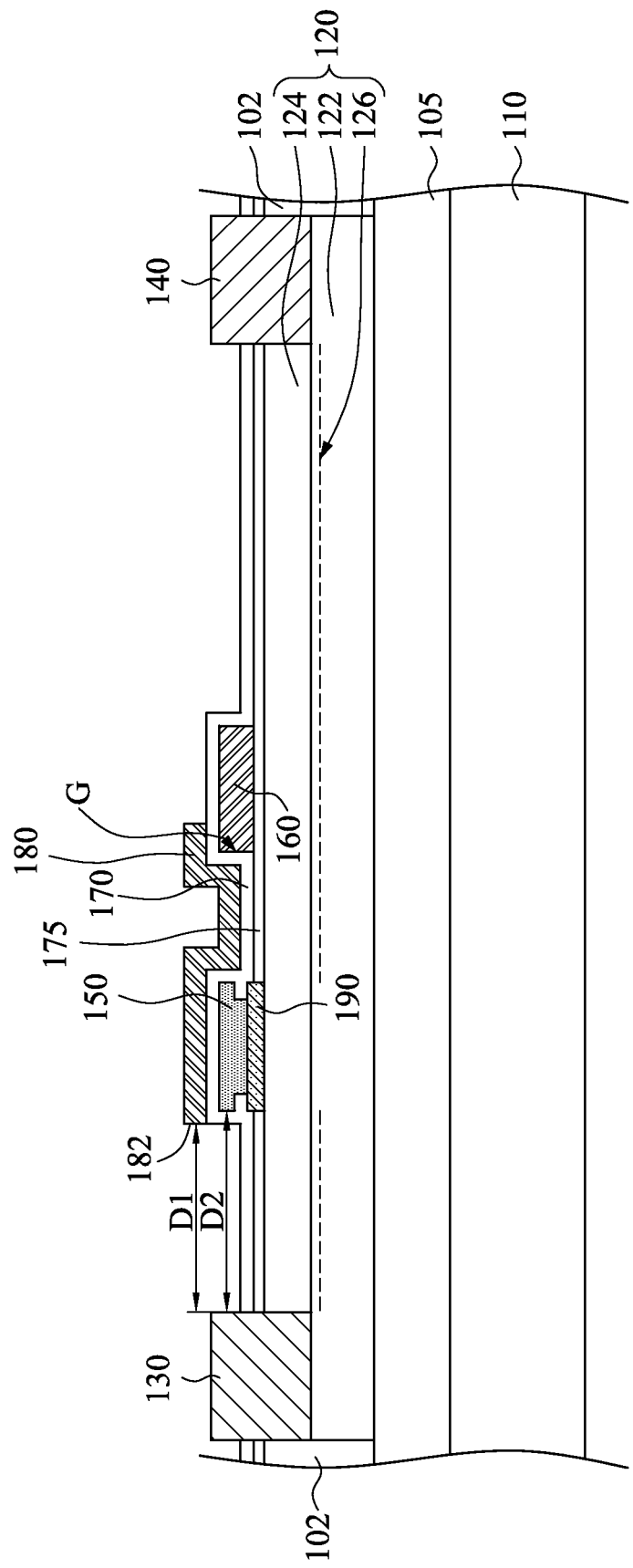
FIG. 2 is a cross-sectional view of a semiconductor device according to another embodiment of the present invention.

In this embodiment, a side 182 of the metal layer 180 facing the source electrode 130 is disposed above the gate electrode 150. In other words, the horizontal distance D1 between the metal layer 180 and the source electrode 130 is longer than the horizontal distance D2 between the gate electrode 150 and the source electrode 130. In this embodiment, the metal layer 180 overlaps the gate electrode 150, and does not protrude a side of the gate electrode 150 which facing the source electrode 130, and the claimed scope is not limited in this respect. FIG. 2 is a cross-sectional view of a semiconductor device according to another embodiment of the present invention. In this embodiment, the metal layer 180 entirely covers the gate electrode 150. That is, the horizontal distance D1 can be equal to or shorter than the horizontal distance D2. Since other details of the exemplary embodiment illustrated in FIG. 2 are similar to that of FIG. 2, further descriptions therefore are omitted.

Reference is made to FIG. 1. In this embodiment, a side 184 of the metal layer 180 which facing the drain electrode 140 is disposed above the field plate 160. In other words, the horizontal distance D3 between the metal layer 180 and the drain electrode 140 is longer that the horizontal distance D4 between the field plate 160 and the drain electrode 140. In this embodiment, the metal layer 180 overlaps the field plate 160, and does not protrude a side of the field plate 160 which facing the drain electrode 140. Such configuration makes the side 184 of the metal layer 180 separated from the active layer 120 by the field plate 160, such that the side 182 of the metal layer 180 would not generate the fringing electric field around the active layer 120, thereby avoiding interfering the electric field distribution around the active layer 120.

In this embodiment, the field plate 160 is electrically connected to the source electrode 130. In other words, the field plate 160 and the metal layer 180 are both electrically connected to the source electrode 130. In this way, there is no additional capacitance to be generated between the field plate 160 and the metal layer 180. In addition, since the field plate 160 is disposed between the gate electrode 150 and the drain electrode 140, this configuration can reduce the electric influence which would be generated between the gate electrode 150 and the drain electrode 140. In some embodiments, the field plate 160 can electrically connect to the source electrode 130 and/or the metal layer 180 through external circuits or interlayer connection structures, and the claimed scope of the present invention is not limited in this respect.

In other embodiments, the field plate 160 can be electrically connected to the gate electrode 150, thereby another gate-source capacitance can be formed between the field plate 160 and the metal layer 180. By adjusting the thickness T of the first passivation layer 170 and/or the overlapping area between the field plate 160 and the metal layer 180, the gate-source capacitance between the field plate 160 and the metal layer 180 can be changed accordingly. In some embodiments, the field plate 160 can be electrically connected to the gate electrode 150 through external circuits or interlayer connection structures, and the claimed scope of the present invention is not limited in this respect.

In one or more embodiments, the active layer 120 includes a pluralities of different nitride-based semiconductor layers to generate 2DEG 126 at the heterojunction as a conductive path. For example, in some embodiments, a channel layer 122 and a barrier layer 124 stacked together can be used. The barrier layer 124 is disposed on the channel layer 122. With such configuration, the 2DEG 126 can exist at the junction between the channel layer 122 and the barrier layer 124. Therefore, when the semiconductor device is on, the on-current between the source electrode 130 and the drain electrode 140 can flow along the junction between the channel layer 122 and the barrier layer 124. In some embodiments, the channel layer 122 can be a GaN layer, and the barrier layer 124 can be an AlGaN layer. Moreover, the substrate 110 can be a silicon substrate or a sapphire substrate, and the claimed scope of the present invention is not limited in this respect. In this embodiment, the semiconductor device can further include a buffer layer 105 disposed between the active layer 120 and the substrate 110. In addition, the semiconductor device can further include an insulating region 102 surrounding the active layer 120. The insulating region 102 can prevent the leakage current and promote the breakdown voltage.

In this embodiment, the semiconductor device further include a P-type doped layer 190 disposed between the gate electrode 150 and the active layer 120. The P-type doped layer 190 can be a layer used to suppress the 2DEG 126 of the active layer 120 which below the gate electrode 150, to thereby interrupt the 2DEG 126 below the P-type doped layer 190, and the utility still exists when there is no applied voltage. Therefore, the semiconductor device of the present invention is a normally-off (enhanced mode) device.

In this exemplary embodiment, the semiconductor device further include a second passivation layer 175 disposed between the field plate 160 and the active layer 120. That is, the field plate 160 is disposed above the second passivation layer 175. By adjusting the thickness of the second passivation layer 175, the second distance d2 between the field plate 160 and the active layer 120 can be changed. In some embodiments, the first passivation layer 170 and the second passivation layer 175 can be made of $Al_2O_3$, AlN, $Si_3N_4$, $SiO_2$, $HfO_2$, or combinations thereof.

In some embodiments, the first distance d1 can be about 20 nanometers to about 200 nanometers, and the second distance d2 can be about 50 nanometers to about 300 nanometers, and the claimed scope of the present invention is not limited in this respect. Basically, an embodiment fills within the scope of the present invention as long as the field plate 160 is lower than the gate electrode 150 to disperse the electric field of the gate electrode 150.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor device, comprising:
    a substrate;
    an active layer disposed on the substrate;
    a source electrode and a drain electrode respectively electrically connected to the active layer;
    a gate electrode disposed between the source electrode and the drain electrode and above the active layer;
    a field plate disposed above the active layer and between the gate electrode and the drain electrode;
    a first passivation layer covering the gate electrode and the field plate; and
    a metal layer disposed on the first passivation layer, disposed above the gate electrode and the field plate, and electrically connected to the source electrode, wherein a horizontal distance between the metal layer and the source electrode is equal to or longer than a horizontal distance between the gate electrode and the source electrode.

2. The semiconductor device of claim 1, wherein a first distance is formed between the gate electrode and the active layer, a second distance is formed between the field plate and the active layer, and the second distance is shorter than the first distance.

3. The semiconductor device of claim 1, wherein a portion of the first passivation layer disposed between the gate electrode and the metal layer has a thickness, and the thickness is less than 500 nanometers.

4. The semiconductor device of claim 1, wherein a gap is formed between the gate electrode and the field plate, and the metal layer entirely covers the gap.

5. The semiconductor device of claim 1, wherein a side of the metal layer facing the source electrode is disposed above the gate electrode.

6. The semiconductor device of claim 1, wherein a side of the metal layer facing the drain electrode is disposed above the field plate.

7. The semiconductor device of claim 2, wherein the first distance is about 20 nanometers to about 200 nanometers.

8. The semiconductor device of claim 2, wherein the second distance is about 50 nanometers to about 300 nanometers.

9. The semiconductor device of claim 1, wherein the field plate is electrically connected to the source electrode.

10. The semiconductor device of claim 1, wherein the field plate is electrically connected to the gate electrode.

11. The semiconductor device of claim 1, further comprising:
    a second passivation layer disposed between the field plate and the active layer.

12. The semiconductor device of claim 1, wherein the metal layer entirely covers the gate electrode.

13. The semiconductor device of claim 1, wherein a horizontal distance between the metal layer and the drain electrode is longer than a horizontal distance between the field plate and the drain electrode.

* * * * *